(12) United States Patent
Hynecek

(10) Patent No.: US 8,409,903 B2
(45) Date of Patent: Apr. 2, 2013

(54) IMAGE SENSOR WITH IMPROVED COLOR CROSSTALK

(75) Inventor: Jaroslav Hynecek, Allen, TX (US)

(73) Assignee: Intellectual Ventures II L.L.C., Wilmington, DE (US)

( * ) Notice: Subject to any disclaimer, the term of this patent is extended or adjusted under 35 U.S.C. 154(b) by 0 days.

(21) Appl. No.: 13/077,104

(22) Filed: Mar. 31, 2011

(65) Prior Publication Data
US 2011/0177646 A1    Jul. 21, 2011

Related U.S. Application Data

(62) Division of application No. 11/730,177, filed on Mar. 29, 2007, now Pat. No. 7,928,478.

(30) Foreign Application Priority Data

Oct. 13, 2006 (KR) .................. 10-2006-0099759

(51) Int. Cl.
*H01L 21/00* (2006.01)
(52) U.S. Cl. ........................................... 438/59
(58) Field of Classification Search ............ 438/57, 438/59, 60
See application file for complete search history.

(56) References Cited

U.S. PATENT DOCUMENTS

| 6,107,655 | A | 8/2000 | Guidash |
| 6,351,001 | B1* | 2/2002 | Stevens et al. .............. 257/223 |
| 7,579,637 | B2 | 8/2009 | Nam et al. |
| 2006/0163618 | A1* | 7/2006 | Park .............................. 257/221 |
| 2006/0214249 | A1 | 9/2006 | Nam et al. |
| 2007/0023801 | A1 | 2/2007 | Hynecek |

FOREIGN PATENT DOCUMENTS

| JP | 53-069526 | 6/1978 |
| KR | 1020060103660 | 4/2006 |
| KR | 1020060085481 | 7/2006 |

* cited by examiner

*Primary Examiner* — Bradley K Smith
(74) *Attorney, Agent, or Firm* — McAndrews, Held & Malloy, Ltd.

(57) ABSTRACT

An image sensor comprises a substrate of a first conductivity type. First and second pixels are arrayed over the substrate. A potential barrier is formed in a region of the substrate corresponding to the first pixel but not in a region of the substrate corresponding to the second pixel. The second pixel is responsive to a color having a wavelength longer than the color to which the first pixel is responsive. The potential barrier is doped with dopants by a high energy ion implantation dopants or by an ion implantation or diffusion during epitaxial growth of the P-type epitaxial layer.

14 Claims, 2 Drawing Sheets

IMAGE SENSOR WITH IMPROVED COLOR CROSSTALK

CROSS-REFERENCE TO RELATED APPLICATIONS

This application is a divisional of U.S. patent application Ser. No. 11/730,177, entitled "IMAGE SENSOR WITH IMPROVED COLOR CROSSTALK," filed Mar. 29, 2007 now U.S. Pat. No. 7,928,478, which in turn claims priority to Korean patent application 10-2006-0099759, filed on Oct. 13, 2006, both of which are hereby incorporated by reference in their entireties.

BACKGROUND OF THE INVENTION

The present invention relates to a solid-state image sensor, more particularly, to a complementary metal-oxide semiconductor (CMOS) image sensor including small pixels covered with light absorbing color filters.

A typical pixel of a modern CMOS image sensor includes a photodiode, more specifically, a pinned photodiode, and four transistors. The photodiode collects photo-generated charge that is later transferred onto a floating diffusion (FD) node at a suitable moment by a charge transfer transistor. The FD node functions as a charge detection node. Prior to the charge transfer, the FD node needs to be reset to a suitable reference voltage. The reset causes kTC noise, which would be normally added to a signal appearing on the FD node. Thus, it is necessary to read the voltage on the FD node twice, the first time before the charge transfer, and the second time after the charge transfer. This operation is called CDS (Correlated Double Sampling). The CDS operation allows sensing of only the voltage difference on the node caused by the transferred charge from the photodiode.

A source follower (SF) transistor senses the voltage on the FD node through a gate of the SF transistor connected to the FD node, a drain thereof connected to a power voltage (Vdd) terminal, and a source thereof connected to a common column sense line via addressing transistor. For this reason, incorporating 4 transistors in each pixel of a standard CMOS image sensor is generally necessary. U.S. Pat. No. 5,625,210 issued to Paul P. Lee et al. in the name of "Active Pixel Sensor Integrated with Pinned Photodiode" describes one exemplary 4T pixel circuit with a pinned photodiode.

In modern CMOS sensor designs, the circuitry for several photodiodes may be shared as can be found exemplarily in U.S. Pat. No. 6,657,665 B1, issued to R. M. Guidash et al., entitled "Active Pixel Sensor with Wired Floating Diffusions and Shared Amplifier." In this patent application, a dual pixel includes two photodiodes located in adjacent rows of a sensor image array and sharing the same circuitry.

The color sensing in most modern CMOS image sensors is accomplished by placing suitable color filters over the photodiodes as is shown in FIG. 1. A blue color filter 101 absorbs green and red light and lets only the blue light photons to enter the photodiode area below. Similarly, a green color filter 102 absorbs blue and red light and lets only the green light photons to enter the silicon bulk below. Reference numeral 103 represents a red color filter. Blue light and green light photons have high energy and thus, are generally absorbed very quickly within a depth Xg defined from the surface of the silicon bulk to a certain region 104 thereof. On the other hand, red light photons have low energy and penetrate a region deeper than the above region 104. More specifically, before generating any photoelectrons, the red light photons can penetrate to an interface 105 between an epitaxial substrate region, located at a depth Xepi, and a highly doped $P^+$-type substrate 106. Reference letter 'Xr' denotes a depth of the interface 105 from the surface of the silicon bulk (i.e., highly doped $P^+$-type substrate 106).

When electrons 107 are generated in the highly doped $P^+$-type substrate 106, the electrons 107 recombine very quickly with the holes located in the highly doped $P^+$-type substrate 106 and cannot be collected in the "red" photodiode. Those electrons 108, on the other hand, which are generated in an un-depleted epitaxial layer 109, have much longer lifetime than the electrons 107, and diffuse freely in the un-depleted epitaxial layer 109 both laterally and vertically until the electrons 108 reach the boundary of depletion regions 110. The boundary of the depletion regions 110 is located at a depth Xd1 from the surface of the silicon bulk.

When electrons 111 enter the depletion regions 110, the electrons 111 are quickly swept into respective photodiode potential wells located in regions where N-type doped layers 112 are formed. The photodiodes are formed close to the surface of the silicon bulk by the N-type doped layers 112 and $P^+$-type pinning layers 113. This structure is called the pinned photodiode. The $P^+$-type pinning layers 113 each extend along the sides and the bottom of respective shallow trench isolation (STI) regions 114, each formed by etching the silicon bulk, to separate and isolate the photo sites and the corresponding electrical circuits from each other. The STI regions 114 are filled with silicon dioxide. The silicon dioxide also covers the photodiode surface area and extends under transfer gates 117. Reference numeral 115 and 116 respectively represent the silicon dioxide filling the STI regions 114 and the silicon dioxide extending under the transfer gates 117 while covering the photodiode surface area. The transfer gates 117 are formed of polycrystalline silicon.

When a suitable bias is applied to each of the transfer gates 117 via corresponding connections 118 (shown only schematically), electron charge stored in the photodiode potential wells is transferred onto respective FD nodes 119 formed by doping $N^+$-type dopants. The FD nodes 119 usually experience a voltage change. This voltage change is then sensed by suitable amplifiers (SFs), which are connected individually to the FD nodes 119 by respective wires 120 (also shown only schematically). The voltage change represents a desired signal. The photodiodes and the transfer gates 117 are typically covered by another layer 121, formed by silicon dioxide or multiple layers of silicon dioxide, and other transparent films before color filters are deposited on the top. Microlenses (not shown in the drawing) are then also deposited on top of the blue, green and red color filters 101, 102 and 103 to focus the light on the surface area of the photodiodes.

As can be easily understood from FIG. 1, those electrons generated by the red light in the un-depleted epitaxial layer 109 can also diffuse laterally and enter the depletion regions 110 of the neighboring photodiodes. This phenomenon often causes unwanted color crosstalk, since the red light-generated electrons usually end up in wrong photodiode potential wells of the "green" or "blue" photodiodes. This color crosstalk may be pronounced in small size pixels where the lateral dimension of the pixel is less than 2 μm, while the vertical dimension remains on the order of 5 μm. The color crosstalk can be reduced by decreasing the thickness of the epitaxial layer (i.e., the depth Xr of the interface 105) and thus, reducing the thickness of the un-depleted epitaxial layer 109 or extending the boundary of the depletion regions 110 located at the depth Xd1 to a depth Xd2.

However, the above-described two approaches may have some limitations. The shallow epitaxial thickness causes too many of the red light electrons to be generated in the highly doped P+-type substrate 106 and thus recombined with the holes in the highly doped P+-type substrate 106. As a result, the red light electrons may not contribute to the signal. It is usually desirable to have the epitaxial thickness on the order of 5.0 μm or larger to have a good "red" light response.

The thick depletion that extends all the way to the interface 105 may also cause limitations. The low doping of the epitaxial layer that is necessary to accomplish the thick depletion may increase the dark current generation, and may lead to the discontinuity and separation of the P+-type pinning layers 113 located near the surface from the highly doped P+-type substrate 106 as indicated by the separated depletion layer boundaries 122 for this level of epitaxial doping. When the discontinuous and separated P+-type pinning layers 113 are observed, it is necessary to provide other electrical connections to the P+-type pinning layers 113 by some other means such as metal wires placed over the top of the pixels. These electric connections may reduce the pixel aperture efficiency and consequently the final pixel Quantum efficiency.

SUMMARY OF THE INVENTION

Specific embodiments of the present invention provide an image sensor (e.g., complementary metal-oxide semiconductor (CMOS) image sensor) including small size pixels and improved in color crosstalk.

In accordance with one aspect of the present invention, there is provided an image sensor comprising a substrate of a first conductivity type, first and second pixels arrayed over the substrate, and a potential barrier formed in a region of the substrate corresponding to the first pixel but not in a region of the substrate corresponding to the second pixel.

DESCRIPTION OF SPECIFIC EMBODIMENTS

According to various embodiments of the present invention, small pixel size sensors are improved in the performance, and the improved performance contributes to the reduction in color crosstalk. This effect can be achieved by incorporating a deep high energy Boron implantation under the pixels that receive the blue and green light but not under the pixels that receive the red light or by a low energy ion implantation applied during the P-type epitaxial growth.

The implanted doping creates a small potential barrier in a substrate structure that directs and focuses those carriers generated by the red light deep within the silicon bulk (i.e., the substrate structure) to flow into the "red" photodiodes (photodiodes under the red color filters) and are collected in the "red" photodiodes. The deep Boron implantation also redirects carriers generated by the residual red light penetrating through the imperfect blue and green color filters and generating carriers deep within the silicon bulk under the "blue" and "green" photodiodes, so as to make the carriers generated under the "blue" and "green" photodiodes flow into the "red" photodiodes.

In addition to the reduction in the color crosstalk caused by the red light-generated carriers, the color crosstalk caused by the imperfect blue and green color filters can also be reduced.

As a result, it is possible to build CMOS sensor arrays of pixels with very small size, high performance and reduced color crosstalk.

Figure 1:
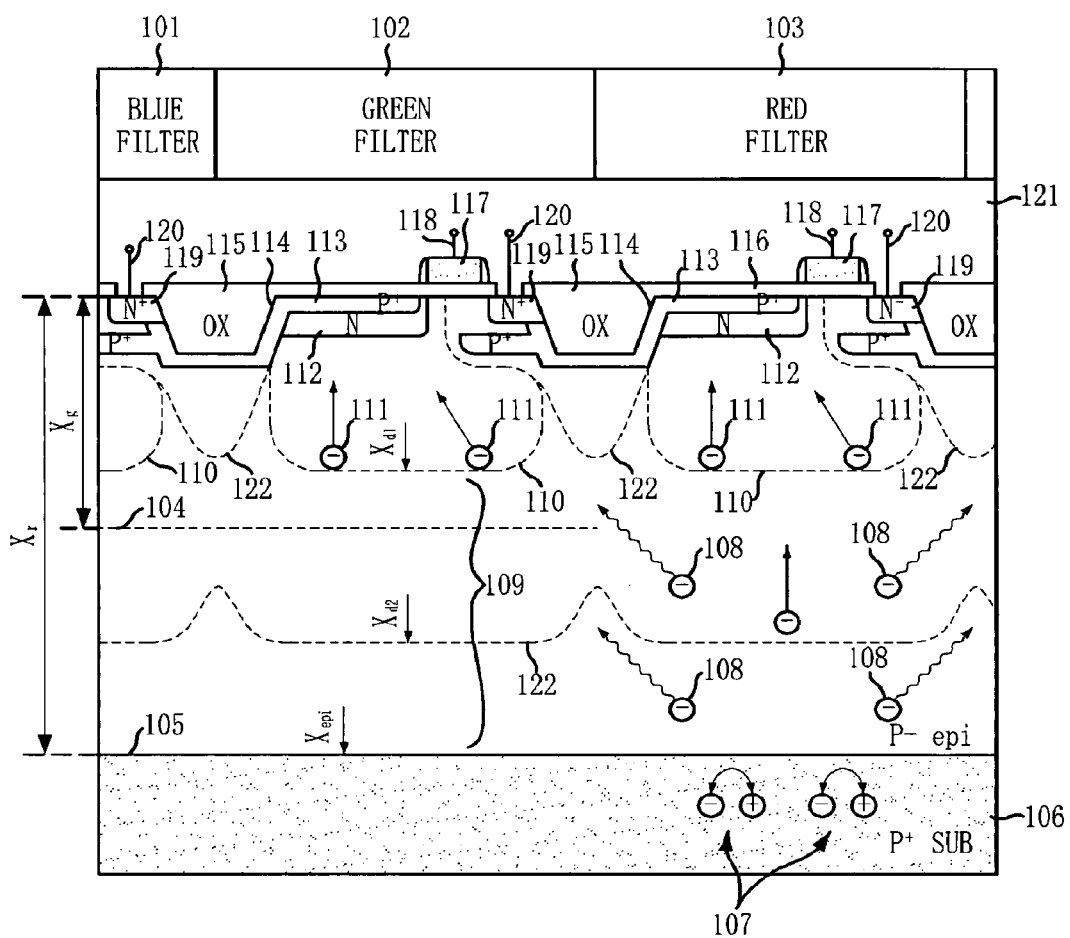
FIG. 1 illustrates a simplified cross-sectional view of conventional pixels overlaid with color filters in a CMOS image sensor.
Figure 2:
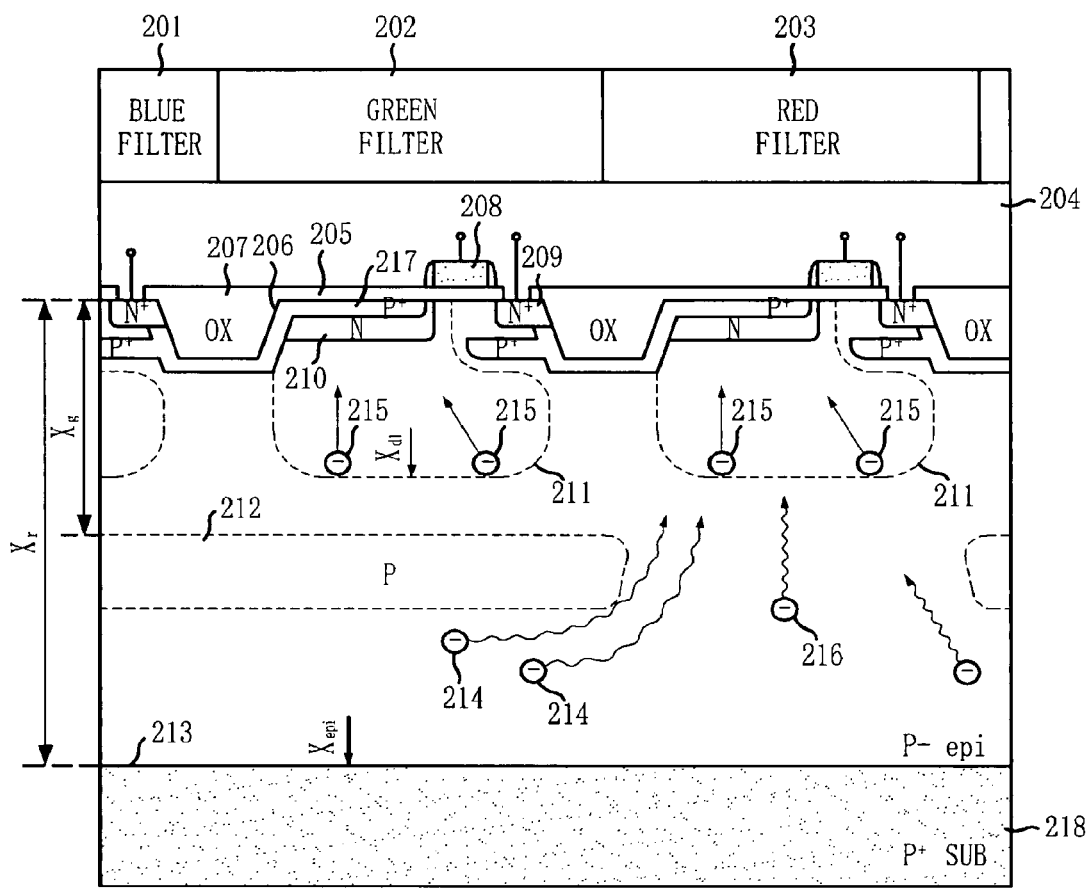
FIG. 2 illustrates a simplified cross-sectional view of pixels overlaid with color filters in a CMOS image sensor in accordance with an embodiment of the present invention.

FIG. 2 illustrates a simplified cross-sectional view of an image sensor including pixels with photodiodes and corresponding transfer transistors in accordance with an embodiment of the present invention. Blue, green and red color filters 201, 202 and 203 are formed over an inter-level transparent dielectric structure 204, which is formed over photodiode regions. P+-type doped layers 217 form pinned photodiode regions together with N-type doped layers 210. The P+-type doped layers 217 each extend over the exposed surface of a silicon bulk (e.g., a highly doped P+-type substrate 218) including the sides and the bottom of shallow trench isolation (STI) regions 206. The STI regions 206 are filled with an oxide-based material 207. Oxide-based layers 205 each cover the surface of the silicon bulk and extend under the respective transfer gates 208. The transfer gates 208 are formed of a conductive material such as polysilicon. The N+-type doped layers 209 form FD regions connected to respective sense amplifiers (not shown).

When the photodiodes, more specifically, pinned photodiodes are depleted of all charge, depletion regions 211 are formed at a depth Xd1 under the pinned photodiodes. A high energy Boron implantation is used to form a P-type doped layer 212 as a potential barrier. The P-type doped layer 212 is located at a depth Xg under "blue" and "green" photodiodes, where most of green and blue light photons have already been converted to electrons 215. These electrons 215 drift upward for a short distance to the boundary of the depletion regions 211 and are quickly swept into photodiode potential wells located in the N-type doped layers 210. Since the vertical diffusion distance can be made very short, there is a little chance of a lateral spread and thus a color crosstalk. Those red light-generated electrons 216 also diffuse directly upward, since the P-type doped layer 212 forms a small potential barrier for the red light-generated electrons 216 and prevents the lateral spread thereof. In addition, other red light-generated electrons 214 under the P-type doped layer 212 cannot also overcome the potential barrier and need to diffuse around the potential barrier to the "red" photodiode potential wells. As a result, the color crosstalk caused by the imperfect color filters can be improved.

For this reason, an epitaxial layer can have a suitable sufficient depth Xr for an efficient conversion of the red light into electrons without the need for a compromise to reduce the lateral spread into wrong photodiodes. An epitaxial-substrate interface 213 can be placed even deeper into the silicon bulk than the conventional epitaxial-substrate interface to further improve the red light conversion to electrons. Reference letter 'Xepi' denotes a depth at which the epitaxial-substrate interface 213 is located. The doping of the epitaxial layer can also be optimized for a minimum dark current and a good conductive connection of the P+-type doped layers 217 to a P+-type doped substrate 218. Accordingly, a silicon bulk pixel aspect ratio, which is the effective pixel silicon thickness to the pixel horizontal dimension, can be increased without adverse effects on the color crosstalk in comparison to the conventional approach.

As is well known, the wavelength of red light is the largest, and descends in the order of green light and blue light. Therefore, the red light-generated charge can be generated at a depth deeper than that of the P-type epitaxial layer. Hence, in consideration of this fact, the P-type doped layer 212 is formed at a suitable depth Xg from the surface of the silicon bulk.

Since the description above did not discuss the pixel circuits and focused only on the photodiodes, it is understood that a shared pixel circuitry may also be used in this embodiment of the present invention. Each pixel may have a shared circuit to read the photo-generated charge as an electrical signal, and the shared circuit can read the photo-generated charge through a shared floating diffusion node.

It is also clear to those skilled in the art that this embodiment of the present invention can be easily adapted to the 3T pixel structure, which represents another embodiment of this invention. Furthermore, it is clear to those skilled in the art that the P-type doped layer 212 does not have to be implanted by a high-energy ion implantation. Instead, the P-type doped layer 212 may be formed during the epitaxial layer growth. The epitaxial growth can be stopped at the depth defined between the depth Xr and the depth Xg. Boron may be implanted by a low energy ion implantation or deposited by some other means. Afterwards, the epitaxial growth can continue until reaching the original depth Xr. This approach represents another embodiment of the invention.

Additionally, it is clear to those skilled in the art that the P-type doped layer 212 can be formed at the depth Xg under the "green" photodiode, and another similar P-type doped layer can be formed at a shallower depth Xb (not shown) than the depth Xg under the "blue" photodiode. This approach represents another embodiment of the present invention.

In the present embodiment, the color crosstalk originating from the carriers generated in the deep region of the substrate structure (e.g., silicon bulk) can be minimized by placing the P-type doped layer, which functions as a potential barrier, under the "green" and "blue" photodiodes and not under the "red" photodiode. Accordingly, it is possible to provide a solid-state image sensor, more particularly, CMOS image sensor that has a small pixel size, good response to the red light, and less occurrence of color crosstalk.

Various embodiments of the present invention are directed toward the pixels that have an improved crosstalk for the small pixel size, which was accomplished by incorporating deep P-type layers under the "green" and "blue" photodiodes and not under the "red" photodiodes. However, this improvement is intended to be illustrative and not limiting, and it should be noted that the persons skilled in the art can make modifications and variations in light of the above teachings. It is therefore to be understood that changes may be made in the particular embodiments of the invention disclosed, which are within the scope and spirit of the invention as defined by appended claims.

The invention claimed is:

1. A method of forming an image sensor, the method comprising:
   forming an epitaxial layer without a potential barrier and including a first region corresponding to a first photodiode, a second region corresponding to a second photodiode, and a thickness between a top surface of the epitaxial layer and an interface of the epitaxial layer with a substrate;
   implanting ions within the epitaxial layer without the potential barrier to form a potential barrier in the first region but not in the second region;
   wherein the potential barrier is separated from the top surface by an upper portion of the first region; and
   wherein the potential barrier is separated from the interface by a lower portion of the first region.

2. The method of claim 1, further comprising:
   forming a first filter above the first region, wherein the first filter is configured to pass light of a first color into the first region; and
   forming a second filter above the second region, wherein the second filter is configured to pass light of a second color into the second region.

3. The method of claim 2, wherein the first color comprises at least one of blue or green, and wherein the second color comprises red.

4. The method of claim 2, wherein the upper portion of the first region is arranged as an area where a majority of photons of the first color are converted to electrons.

5. The method of claim 1, wherein the potential barrier is formed to prevent electrons formed in the lower portion of the first region from flowing into the upper portion of the first region.

6. The method of claim 1, wherein the potential barrier is formed to sweep electrons formed in the lower portion of the first region into the second region.

7. The method of claim 1, wherein the potential barrier comprises a P-type doped region.

8. A method of forming an image sensor, the method comprising:
   forming an epitaxial layer without a potential barrier including a first region corresponding to a first photodiode, a second region corresponding to a second photodiode, a third region corresponding to a third photodiode, and a thickness between a top surface of the epitaxial layer and an interface of the epitaxial layer with a substrate;
   implanting ions within the epitaxial layer without the potential barrier to form a potential barrier in the first region and the third region, but not in the second region;
   wherein the potential barrier is separated from the top surface by an upper portion of the first region and an upper portion of the third region; and
   wherein the potential barrier is separated from the interface by a lower portion of the first region and a lower portion of the third region.

9. The method of claim 8, further comprising:
   forming a first filter above the first region, wherein the first filter is configured to pass light of a first color into the first region;
   forming a second filter above the second region, wherein the second filter is configured to pass light of a second color into the second region; and
   forming a third filter above the third region, wherein the third filter is configured to pass light of a third color into the third region.

10. The method of claim 9, wherein:
    the first color comprises blue;
    the second color comprises red; and
    the third color comprises green.

11. The method of claim 9, wherein:
    the upper portion of the first region is arranged as an area where a majority of photons of the first color are converted to electrons; and
    the upper portion of the third region is arranged as an area where a majority of photons of the third color are converted to electrons.

12. The method of claim 8, wherein the potential barrier is formed to prevent electrons formed in the lower portion of the first region and the lower portion of the third region from flowing into the upper portion of the first region and the upper portion of the third region.

13. The method of claim 8, wherein the potential barrier is formed to sweep electrons formed in the lower portion of the first region and the lower portion of the third region into the second region.

14. The method of claim 8, wherein a thickness of the upper portion of the first region is different than a thickness of the upper portion of the third region.

* * * * *